United States Patent [19]

Dressler et al.

[11] 4,415,894
[45] Nov. 15, 1983

[54] SWITCHING CIRCUITRY FOR LOAD CONTROL UTILIZING MOS-FETS

[75] Inventors: Daryl D. Dressler; Jimmy L. Fiala, both of St. Paul, Minn.

[73] Assignee: Minnesota Mining and Manufacturing Company, St. Paul, Minn.

[21] Appl. No.: 453,276

[22] Filed: Dec. 27, 1982

[51] Int. Cl.³ .................. H04Q 9/00; H03K 17/00
[52] U.S. Cl. .................. 340/825.57; 307/270; 307/570
[58] Field of Search .......... 340/825.59, 310 R, 825.98, 340/825.57, 825.77, 825.79; 307/126, 131, 140, 307/448, 570, 270, 265

[56] References Cited

U.S. PATENT DOCUMENTS

| | | | |
|---|---|---|---|
| 3,970,869 | 7/1976 | Coats, Jr. | 307/570 |
| 4,068,135 | 1/1978 | Sonobe et al. | 307/570 |
| 4,213,065 | 7/1980 | Marcom | 307/265 |
| 4,303,907 | 12/1981 | Wilson | 340/825.79 |
| 4,356,416 | 10/1982 | Weischedel | 307/570 |
| 4,360,744 | 11/1982 | Taylor | 307/270 |

Primary Examiner—Donald J. Yusko
Attorney, Agent, or Firm—Donald M. Sell; James A. Smith; Robert L. Marben

[57] ABSTRACT

Improved switching circuitry for use in connecting a remote control signal circuit to an electrically powered circuit wherein power for the remote control signal circuit is provided by the electrically powered circuit. Power metal-oxide-semiconductor field-effect transistors (MOS-FETs) are connected to a control signal output of the control signal circuit and provide the function of at least one diode of a full-wave rectifier bridge in the switching circuitry. The MOS-FETs respond to a logic 1 control signal to establish a low impedance path across the output of the full-wave rectifier that is connected to the electrically powered circuit.

2 Claims, 2 Drawing Figures

SWITCHING CIRCUITRY FOR LOAD CONTROL UTILIZING MOS-FETS

BACKGROUND OF THE INVENTION

The invention presented herein relates to switching circuitry that is connectable between an electrically powered circuit and a remote control signal circuit for supplying d.c. power to the remote control signal circuit from the electrically powered circuit and is connectable with the remote control signal circuit for receiving binary logic control signals from the remote control signal circuit. Such switching circuitry is operative in response to a logic control signal from the remote control circuit to provide a low impedance path across the connection made by the switching circuitry to the electrically powered circuit. In particular, the invention relates to an improvement to such switching circuitry involving the use of metal-oxide-semiconductor field-effect transistors in the switching circuitry allowing the switching circuitry to have broader application.

Situations arise wherein an electrically powered circuit is operable in response to the application of a momentary low impedance path such as may be provided by momentary closure of a switch. In cases where it is desirable to provide for operation of such an electrically powered circuit by an add-on circuit that is to be connected by a consumer-user, it is desirable that it be applicable to as many of the particular electrically powered circuits of various manufacture as possible and that it be connectable without concern for electrical polarity of whether d.c. or a.c. is involved.

One example of the situation just described involves the electrically powered circuit used for automatic garage door openers. Such circuitry is operable to open and close a garage door in response to the momentary closure of a switch by the user. It was recognized that it would be desirable to have an add-on circuit remote control signal including a keyboard switch panel mounted outside the garage entrance, which, upon entry of a code by manual operation, would cause circuitry that is located within the garage entrance and connected between the keyboard switch panel and automatic garage door opener circuitry to provide for momentary operation of a switch means included in switching circuitry to effect operation of the garage door opener circuitry. Such circuitry is disclosed in United States patent application Ser. No. 316,233, filed by Daryl D. Dressler on Oct. 29, 1981. The switching circuitry disclosed in the above-mentioned patent application includes a conventional full-wave rectifier formed by the interconnection of four diodes. The input of the full-wave rectifier is connectable to an electrically powered circuit and has its output connected to a control signal circuit via a power storage circuit portion of the switching circuit. The control signal circuit has an output which provides logic 1 or logic 0 signals. A switch means provided by the switching circuit is connected across the output of the full-wave rectifier. A transistor provides the switch means. The base of the transistor is arranged to receive a logic 1 or logic 0 signal from the control signal circuit.

While the switching circuit described provides an impedance path that is sufficiently low so that it is effective for use with the circuitry for a large number of different automatic garage door opener circuits to cause the garage door opener circuitry to operate, it presents an impedance path that is too high to allow the switching circuit to be used with garage door opener circuits that use a microprocessor.

SUMMARY OF THE INVENTION

The present invention provides a solution to the impedance problem presented by the prior art switching circuit while retaining all the advantages of the prior art switching circuit and without any significant increase in cost or complexity.

The invention presented herein resides in the improvement to a switching circuit for supplying d.c. power from an electrically powered circuit to a control signal circuit, the control signal circuit having an output providing logic 1 or logic 0 signals, the switching circuit including a full-wave rectifier having four diodes with the input of the full-wave rectifier connectable for energization from the electrically powered circuit, the output of the full-wave rectifier connectable to the control signal circuit via a power storage circuit portion and a switch means connected to the full-wave rectifier, the switch means having a control electrode connectable to the output of the control signal circuit, said switch means operable in response to the presence of a logic 1 signal presented to the control electrode for establishing a low impedance path across the input of the full-wave rectifier. The improvement includes the use of two power metal-oxide-semiconductor field-effect transistors, hereinafter abbreviated power MOS-FETs, for providing the function of the switch means plus that of at least one of the four diodes of the full-wave rectifier, each of the power metal-oxide-semiconductor field-effect transistors having a drain electrode, a source electrode and a gate electrode. It is inherent in the design of power MOS-FETs that there is structure that functions to provide a diode action between source and drain with the cathode of such diode connected to the drain. The current capacity of this diode action equals the forward current rating of the MOS-FET device. The source electrodes of the MOS-FETs are connected together to provide one output connection for the full-wave rectifier. At least one of the drain electrodes is connected to the full-wave rectifier. The gate electrodes are connectable to the output of the control signal circuit for receiving logic 1 or logic 0 signals from the control signal circuit. The power MOS-FETs respond to a logic 1 signal from the control signal circuit to establish the low impedance path across the input to the full-wave rectifier.

In another arrangement, the two power MOS-FETs are connected to provide the diode function of two of the four diodes of the full-wave rectifier. As in the other arrangement, the MOS-FETs respond when the control signal circuit provides a logic 1 signal to establish the low impedance path across the input to the full-wave rectifier.

BRIEF DESCRIPTION OF THE DRAWING

The novel features and advantages of the invention presented herein will become more apparent to those skilled in the art upon consideration of the following detailed description which refers to the drawing wherein.

DETAILED DESCRIPTION

Figure 1:
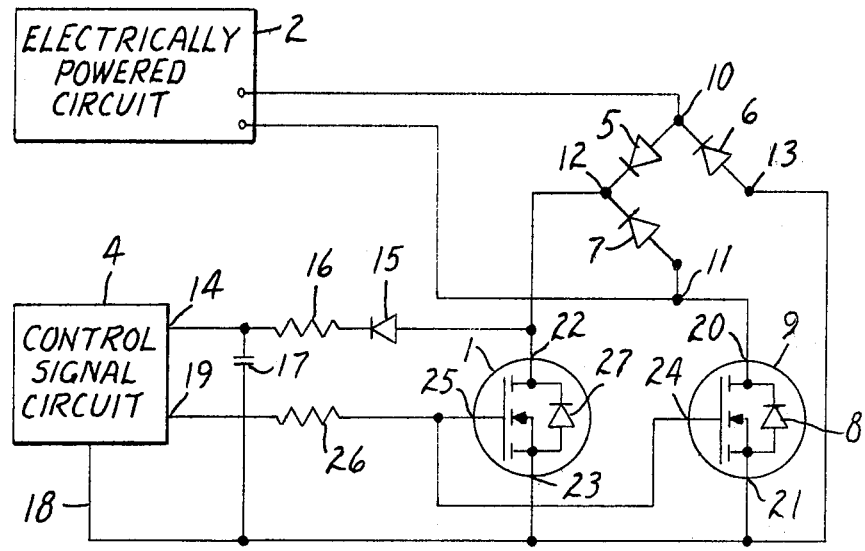
FIG. 1 is a schematic circuit of one embodiment of the invention.

Referring to FIG. 1 of the drawing, a switching circuit embodying the invention presented herein is shown connected between an electrically powered circuit 2 and a control signal circuit 4. The switching circuit includes a full-wave rectifier circuit portion provided by four diodes 5–8, inclusive, wherein diode 8 is provided by a power MOS-FET 9 wherein the equivalent of a P-N junction diode is present between the source and drain of the power MOS-FET placing it in parallel with the MOS-FET. The other diodes are silicon diodes. The input of the full-wave rectifier is provided between the common connection 10 for the anode of diode 5 and the cathode of diode 6 and the common connection 11 for the anode of diode 7 and the cathode of diode 8 which connects at the drain 20 of power MOS-FET 9. The input of the full-wave rectifier is shown connected to the electrically powered circuit 2 between two points in the circuit 2 where an a.c. or d.c. voltage is present. The output of the full-wave rectifier is provided between the common connection 12 for diodes 5 and 7 and common connection 13 for diodes 6 and 8. The output 12 of the full-wave rectifier is connected to one input 14 of the control signal circuit 4 via a diode 15 and series connected current limiting resistor 16. A capacitor 17 is connected between a common connection 18 and the end of resistor 16 connected to the circuit 4. The diode 15, resistor 16 and capacitor 17 can be considered as a power storage circuit portion. The other output terminal 13 of the full-wave rectifier is connected to the control signal circuit 4 via a common connection 18. The control signal circuit 4 has an output 19 at which logic 1 or 0 signals are provided. The switching circuit of FIG. 1 includes a switch means which is provided by the power MOS-FET 9 and power MOS-FET 1. The drain electrode 20 of MOS-FET 9 is connected to the input terminal 11 of the full-wave rectifier while its source electrode 21 is connected to control circuit common 18 which connects to the output 13 of the full-wave rectifier. The drain electrode 22 of MOS-FET 1 is connected to the output terminal 12 of the full-wave rectifier while its source electrode 23 is connected to control circuit common 18. The gate electrodes 24 and 25 of MOS-FET 9 and 1, respectively, are connected to the output 19 of the control signal circuit 4 via a current limiting resistor 26. Ohmic conduction of a MOS-FET occurs when a voltage is impressed between the drain and source electrodes and a logic 1 or positive voltage is received at the gate of the electrode of the MOS-FET. The arrangement of the MOS-FETs shown in FIG. 1 causes a low impedance path to be presented across the input to the full-wave rectifier when a logic 1 signal is provided at the output 19 of control signal circuit 4.

A prior art switching circuit provided for use with an electrically powered circuit 2 and control signal circuit 4 is disclosed in the aforementioned patent application. It did not utilize any MOS-FETs and the diode 8 that is supplied by the power MOS-FET 9 in the circuit of FIG. 1 was provided by a silicon diode. In addition, the prior art switching circuit used an NPN transistor in place of the power MOS-FET 1 wherein the base of the transistor was connected to the control circuit 4 via the resistor 26 with the collector of the transistor connected to the output terminal 12 of the full-wave rectifier and the emitter of the transistor connected to control circuit common 18. The prior art switching circuit, by use of the full-wave rectifier circuit, permitted connection to be made to the electrically powered circuit 2 without regard to polarity or whether a.c. or d.c. voltage was being provided by the circuit 2. The prior art switching circuit operates to provide a positive d.c. voltage to the input 14 of control signal circuit 4 for its operation with the capacitor 17 serving to store electrical power for operation of the control signal circuit 4 during conduction of the transistor. When the control signal circuit 4 operates to provide a positive pulse at the ouput terminal 19, the transistor connected to the output terminal 12 of the full-wave rectifier in the prior art circuit conducts and causes the electrically powered circuit 2 to function in response to the low impedance path presented to the circuit 2 by the conduction of the transistor. This prior art switching circuit has been used in connection with automatic garage door opener circuits wherein the garage door opener circuit provides the electrically powered circuit 2. The momentary conduction of the transistor that is connected between the output 12 of the full-wave rectifier and ground serves to provide a momentary switching action providing a low impedance path across the input to the full-wave rectifier which causes the garage door opener circuitry to operate to open or close the garage door. This prior art switching circuit is not usable with garage door opener circuits in which microprocessors are used. When the transistor in the prior art circuit conducts, a voltage drop of approximately 1.2 volts is presented across two of the diodes in the full-wave rectifier plus a voltage drop of approximately 1 volt due to the collector-emitter saturation voltage of the transistor causing a total drop of two volts or more to be presented to the connection made to the garage door opener circuit. A voltage drop of less than 0.8 volts is required if the switching circuit is to be usable with an electrically powered circuit 2 which utilizes a microprocessor since microprocessor circuitry will view any voltage level above 0.8 volts as a logic 1 signal.

The problem of providing a switching circuit that presents a voltage drop of less than 0.8 volts to the electrically powered circuit 2 when the control signal circuit 4 presents a logic 1 signal is solved by the present invention wherein power MOS-FET 1 is used in place of the transistor of the prior art switch circuit and power MOS-FET 9 is added to the prior art switching circuitry, as has been described in connection with FIG. 1. When conducting, a power MOS-FET presents a relatively constant impedance between the drain and source of the MOS-FET of about four ohms or less. Accordingly, a voltage drop of about 0.6 volts is measured across the connections made to electrically powered circuit 2 drawing about 10 MA when a logic 1 is presented to the power MOS-FETs 9 and 1. This drop is due largely to the drop across one of the silicon diodes in the full-wave rectifier.

While the switching circuit of FIG. 1 responds to a logic 1 signal from control signal circuit 4 to provide a voltage drop across the connection made to the electrically powered circuit 2 that is well within the maximum of 0.8 volts limit for a logic 0 signal, the circuitry of FIG. 2, which also uses power MOS-FETs proviedes a voltage drop that is substantially below the 0.8 volt limit making FIG. 2 the preferred embodiment. Measured test results show a voltage drop of 0.024 VDC with 5.5 V supplied by circuit 2 at 1 MA; 0.170 VDC with 5.5 V from circuit 2 at 10 MA and 1.0 VDC with 5.5 V from circuit 2 at 100 MA.

Figure 2:
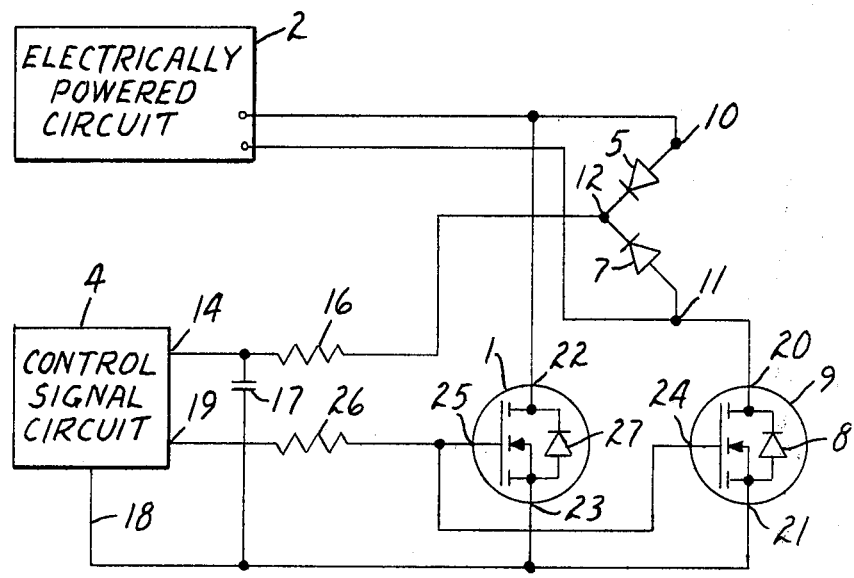
FIG. 2 is a schematic circuit of another embodiment of the invention.

The embodiment of FIG. 2 differs from that of FIG. 1 in that the drain 22 of power MOS-FET 1 is connected to an input connection 10 of the full-wave recitifier rather than to the output connection 12. In addition, diode 6 is removed as is the diode 15. With the arrangement of FIG. 2, diode 27 of power MOS-FET 1 replaces diode 6 which, with diodes 5, 7 and diode 8 of power MOS-FET 9, is connected to provide a full-wave rectifier. As before, connection may be made to electrically powered circuit 2 without regard for polarity or whether circuit 2 supplies a.c. or d.c. voltage. Diode 15 in FIG. 1, which served as a blocking diode in FIG. 1, is not required in FIG. 2 in view of the change made in the connection of the drain electrode 22 for MOS-FET 1. The improvement made with respect to the presentment of a lower voltage drop at the connections made to the electrically powered circuit 2 when the power MOS-FETs receive a logic 1 has already been mentioned. Simplification of the circuitry of FIG. 1 with respect to the number of components used serves to increase its reliability.

What is claimed is:

1. An improved switching circuit for supplying d.c. power from an electrically powered circuit to a control circuit, the control signal circuit having an output providing logic 1 or logic 0 signals, the switching circuit including a full-wave rectifier having four diodes with the input of the full-wave rectifier connectable for energization from the electrically powered circuit, the output of the full-wave rectifier connectable to the control signal circuit via a power storage circuit portion and a switch means connected to the full-wave rectifier, the switch means having a control electrode connectable to the output of the control signal circuit, said switch means operable in response to the presence of a logic 1 signal presented to the control electode for establishing a low impedance path across the input of the full-wave rectifier, the improvement including two power metal-oxide-semi-conductor field-effect transistors connected for providing the function of the switch means plus that of at least one of the four diodes of the full-wave rectifier, each of said power metal-oxide-semiconductor field-effect transistors having a drain electrode, a source electrode, a gate electrode, the source electrodes of said metal-oxide-semiconductor field-effect transistors connected together to provide one output connection for the full-wave rectifier with at least one of the drain electrodes connected to the full-wave rectifier to connect one of said two power metal-oxide-semiconductor field-effect transistors for providing a diode function in the full-wave rectifier, and said gate electrodes connectable to the output of the control signal circuit providing logic 1 or logic 0 signals, said power metal-oxide-semiconductor field-effect transistors responsive to a logic signal from the control signal circuit to establish the low impedance path across the input to the full-wave rectifier.

2. An improved switching circuit according to claim 1 wherein said drain electrodes connect to the full-wave rectifier to connect said two power metal-oxide-semiconductor field-effect transistors in series across the input of the full-wave rectifier whereby said two power metal-oxide-semiconductor field-effect transistors provide the function of two diodes of the full-wave rectifier.

* * * * *